United States Patent
Nagai

(10) Patent No.: US 6,532,652 B2
(45) Date of Patent: Mar. 18, 2003

(54) METHOD FOR MANUFACTURING WIRE HARNESS WITH BRANCH CONNECTION TERMINALS

(75) Inventor: Kentaro Nagai, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 125 days.

(21) Appl. No.: 09/754,269

(22) Filed: Jan. 5, 2001

(65) Prior Publication Data

US 2001/0009067 A1 Jul. 26, 2001

(30) Foreign Application Priority Data

Jan. 26, 2000 (JP) ........................................ 2000-017492

(51) Int. Cl.⁷ ............................................. H01R 43/04
(52) U.S. Cl. .............................. 29/866; 29/831; 29/865; 29/847
(58) Field of Search .......................... 29/847, 857, 865, 29/866, 831

(56) References Cited

U.S. PATENT DOCUMENTS

| | | | | |
|---|---|---|---|---|
| 6,026,563 A | * | 2/2000 | Schilson | ........................ 156/47 |
| 6,099,356 A | * | 8/2000 | Hwang | ........................ 439/660 |
| 6,210,210 B1 | * | 4/2001 | Kozel et al. | ................. 439/495 |
| 6,222,131 B1 | * | 4/2001 | Schilson | ................. 174/117 FF |
| 6,239,373 B1 | * | 5/2001 | Sato et al. | ................. 174/75 C |

FOREIGN PATENT DOCUMENTS

JP   2549583   6/1997

* cited by examiner

*Primary Examiner*—Joseph J. Hail, III
*Assistant Examiner*—Alvin J Grant
(74) *Attorney, Agent, or Firm*—Finnegan, Henderson, Farabow, Garrett, & Dunner, L.L.P.

(57) ABSTRACT

In a method for fabricating a wire harness with branch terminals, a flexible flat cable (FFC) (11) is first prepared by arranging multiple conductive strips (12) in parallel to each other at a predetermined interval, and by laminating a pair of base films (13) with the conductive strips between them. Then, a row of slots (14A) are formed between any two adjacent conductive strips at a predetermined distance from an end of the FFC, thereby defining a connection area (A) between the end of the FFC and the row of slots. Then, multiple connection terminals (16), each having a contact (17) and a plurality of projections (19), are fixed to the connection area of the FFC by causing the projections of each connection terminal to pierce through one of the conductive strips. Finally, slits (14B) are formed from the end of the FFC so that the slits extend between any two adjacent conductive strips and communicate with the associated slots.

12 Claims, 4 Drawing Sheets

METHOD FOR MANUFACTURING WIRE HARNESS WITH BRANCH CONNECTION TERMINALS

The present patent application claims the benefit of earlier Japanese Patent Application No. 2000-017492 filed Jan. 26, 2000, the disclosure of which is entirely incorporated herein by reference.

BACKGROUND OF THE INVENTION

1. Field of the Invention

The present invention relates to a method for manufacturing a wire harness that includes a flexible circuit belt, such as a flexible flat cable (FFC) or a flexible printed circuit (FPC), and one or more branch connection terminals attached to the flexible circuit belt.

2. Description of the Related Art

In general, a terminal connector is used to electrically connect a flat circuit, such as a flexible flat cable or a flexible print board, to another circuit. Such a terminal connector is generally attached to an end portion of the flat circuit, and a counterpart connector of another circuit to be connected receives the terminal connector of the flat circuit.

FIG. 1 illustrates an example of the conventional terminal connection structure of a wire harness, which is disclosed in, for example, Japanese Utility Model Registration No. 2549583. To fabricate the conventional terminal connection structure, multiple slips 2A are formed in advance at an end portion of the flexible print board 2 before multiple connection terminals 1 are attached to the flexible print board 2. The slits 2A make the flexible print board 2 branch off. Each connection terminal 1 is fixed to one of the branches of the flexible print board 2 by making the claws of each connection terminal 1 pierce through a conductive pattern 3 of the flexible print board 2.

The connection terminals 1 and the branches of the flexible print board 2 are then inserted in the cavities 4A of a connector housing 4, as shown in FIG. 1B.

However, it is difficult and troublesome for the conventional technique for fabricating the terminal connection structure of a wire harness to accurately position the connection terminals 1 with respect to the flexible print board 2. This is because the slits 2A are formed in advance at the end portion of the flexible print board 2, and the branches can not stay at the proper position in a stable manner. If any one of the connection terminals 1 is offset relatively from the corresponding branch of the flexible print board 2, the claws of that connection terminal 1 do not correctly pierce through the conductive pattern 3 of the flexible print board 2. In this case, electric connection between the flexible print board 2 and the connection terminal 1 is lost.

In addition, the branches of the flexible print board 2, which are defined by the slits 2A prior to fixing the connection terminals 1, are likely to deform under an external force or a stress during a manufacturing process of a wire harness. Such an external force or a stress is easily applied to the branches by pulling or drawing the flexible print board 2 around. This means that the conventional method for fabricating a wire harness requires careful and cautious handling of the flexible print board 2 so as not to apply any excessive stress or a tension to the branched portions of the print board 2.

SUMMARY OF THE INVENTION

Therefore, it is an object of the invention to overcome these problems in the prior art technique, and to provide a method for fabricating a wire harness with branch connection terminals, which can guarantee both mechanical and electric connection between each terminal and the wire harness. This method can also efficiently prevent displacement or offset of the connection terminals from the proper position on a flexible circuit belt used in the wire harness.

To achieve the object of the invention, a method for fabricating a wire harness first takes the step of preparing a flexible circuit belt by arranging multiple conductive strips in parallel to each other at a predetermined interval, and sandwiching the conductive strips with a pair of base films. Then, multiple connection terminals, each having a contact and a plurality of projections, are fixed to the end portion of the flexible circuit belt by causing the projections of each connection terminal to pierce through one of the conductive strips. The number of connection terminals is equal to the number of the conductive strips. Finally, one or more slits are formed between any two adjacent conductive strip so as to extend from the end of the flexible circuit at a predetermined length.

The flexible circuit belt is cut into branches by forming the slits. Consequently, multiple branch terminals are formed, each consisting of a branch portion of the flexible circuit belt and a connection terminal fixed to that branch portion.

With this method, the end portion of the flexible circuit belt is branched out after the connection terminals are fixed to the flexible circuit belt. Because the end portions of the conductive strips are fixed when the connection terminals are attached to the connection area of the flexible circuit belt, the connection terminals are reliably attached to the designed positions without being offset from the conductive strips.

With an alternatively method, a flexible circuit belt is first prepared by arranging multiple conductive strips in parallel to each other at a predetermined interval, and sandwiching the conductive strips with a pair of base films. Then, a row of slots is formed between any two adjacent conductive strips at a predetermined distance from the end of the flexible circuit belt. A connection area is defined between the end of the flexible circuit belt and the row of slots. Then, multiple connection terminals, each having a contact and a plurality of projections, are fixed to the connection area of the flexible circuit belt by causing the projections of each connection terminal to pierce through one of the conductive strips. Finally, one or more slits are formed from the end of the flexible circuit belt so that the slits extend between any two adjacent conductive strips and communicate with the associated slots.

In this case, the slots are formed in the flexible circuit belt before the connection terminals are fixed to the end portion of the flexible circuit belt. The slots formed at a predetermined distance from the end of the flexible circuit belt allow the flexible circuit belt to be cut into branches easily after the projections of each connection terminal pierce through the conductive strips. The branch terminals formed in this manner are smoothly inserted in the connector housing.

In another aspect of the invention, a wire harness comprising a flexible circuit belt folded in double is fabricated. With this method, a flexible circuit belt is prepared first by arranging multiple conductive strips in parallel to each other at a predetermined interval and sandwiching the conductive strips with a pair of base films. Any two adjacent conductive strips define a non-conductive region between them. Then, two rows of slots are formed in the middle of the flexible circuit belt in such a manner that two slots are aligned along the longitudinal axis of each non-conductive region of the flexible circuit belt at a predetermined distance between them. The two rows of slots are symmetrical with respect to a centerline extending in the width direction of the flexible circuit belt between the rows. Then, the flexible circuit belt is folded in double along the centerline between the two rows of slots so that a row of slots lies on top of the other row of slots. Then, multiple connection terminals, each having a contact and a plurality of projections, are fixed to the folded portion of the flexible circuit belt by causing the projections of each connection terminal to pierce through one of the doubled conductive strips of the folded flexible circuit belt. Finally, one or more slits are formed between any two adjacent conductive strips from the folded edge of the flexible circuit belt so as to communicated with the overlaid slots.

With this method, again, the folded flexible circuit belt is branched out after the connection terminals are fixed to it. Accordingly, positioning of the connection terminals with respect to the associated conductive strips is carried out accurately, and electrical connection between the flexible circuit belt and the connection terminal is guaranteed.

In either method, the flexible circuit belt may be prepared by forming conductive strips on a first base film, and forming a second base film over the conductive strips and the first base film. The base film is preferably an insulating film.

BRIEF DESCRIPTION OF THE DRAWINGS

Other objects and advantages will be apparent from the following detailed description of the invention in conjunction with the attached drawings, in which.

DETAILED DESCRIPTION OF THE PREFERRED EMBODIMENTS (First Embodiment)

FIGS. 2 through 5 illustrate a process of fabricating a wire harness with branch terminals according to the first embodiment of the invention. The wire harness is fabricated using a flexible flat cable (FFC), which is an example of flexible circuit belt, in this embodiment.

Figure 1A:
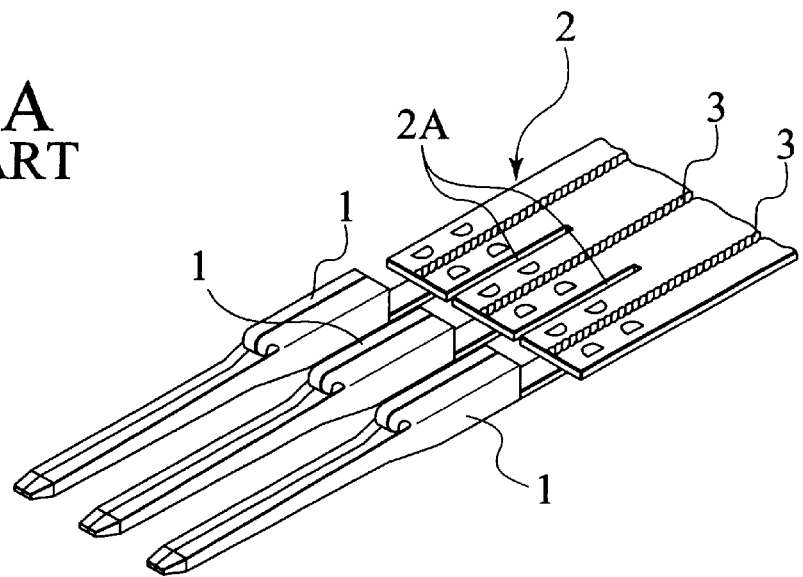
FIG. 1 illustrates a wire harness with branch terminals manufactured by a conventional method, in which the end portion of the flexible print board is branched out first, and then, connection terminals are fixed to the branched.
Figure 1B:
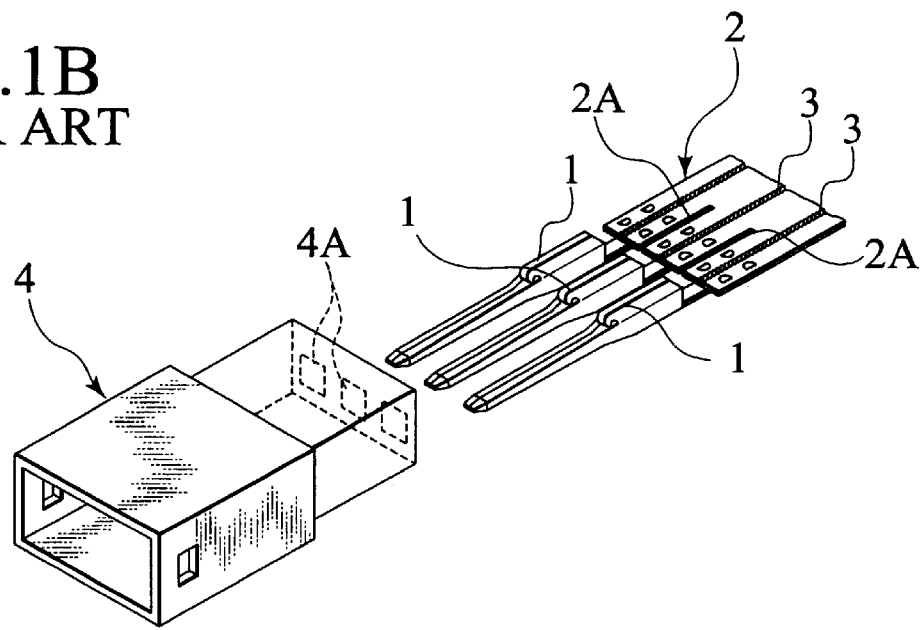
Figure 2:
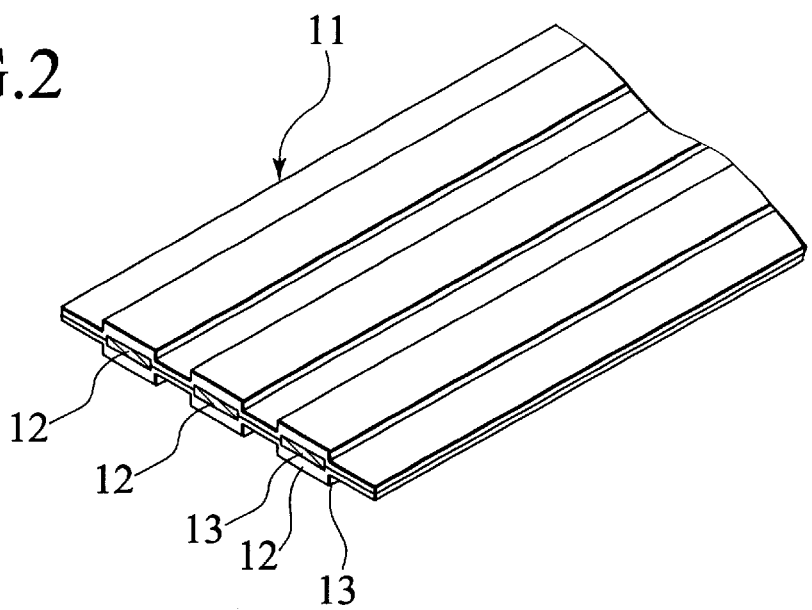
FIG. 2 illustrates the step of preparing a flexible flat cable (FFC) in a method for fabricating a wire harness according to the preferred embodiment of the invention.

First, as shown in FIG. 2, a FFC 11 is prepared by arranging multiple conductive strips 12 in parallel to each other at a predetermined interval and sandwiching the conductive strips 12 by a pair of base films 13. To be more precise, copper foils 12, which were rolled to reduce the thickness, are arranged in parallel to each other. The base films 13, which are insulating films in this embodiment, are then laminated with the conductive strips 12 between them thermally or using an adhesive or any other bonding agen. Any two adjacent conductive strips 12 define a non-conductive region consisting of the base films 2. This FFC 11 becomes a main body of a wire harness, which connects, for example, a power source to many electric devices. Although only three conductive strips 12 are illustrated in FIG. 2, four or more conductive strips may be arranged in the FFC 11.

Figure 3:
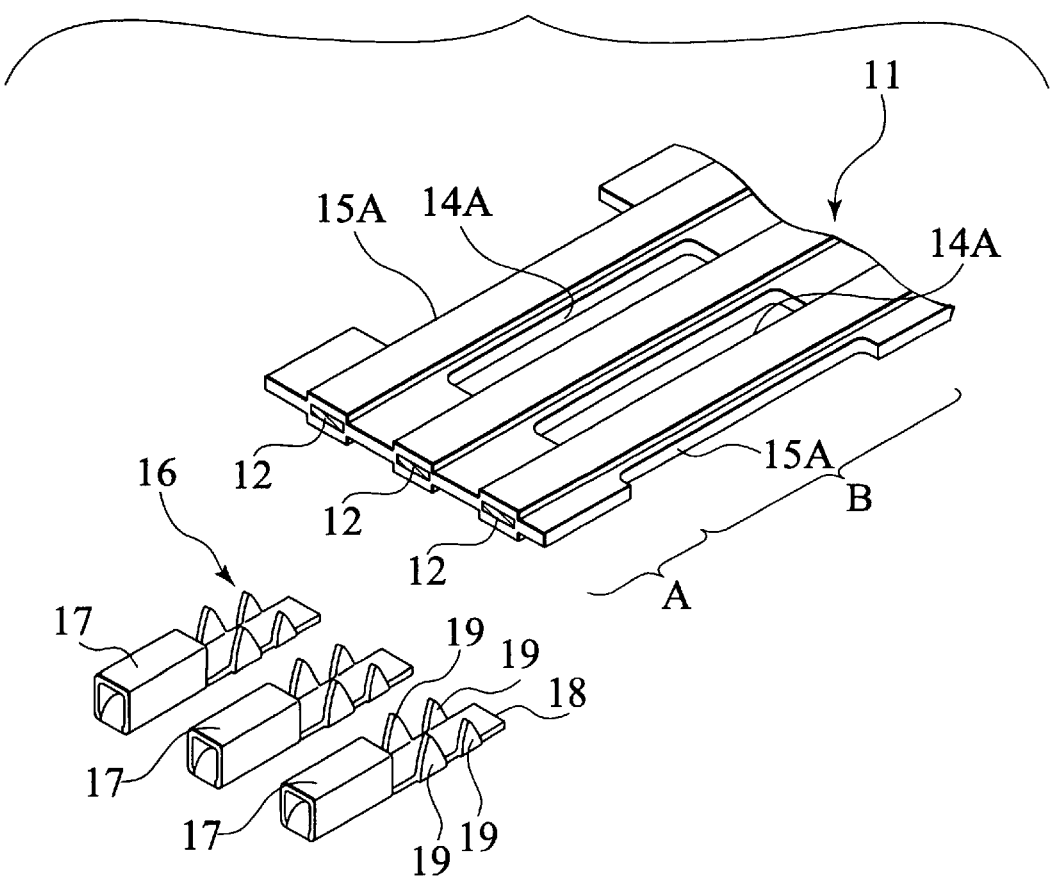
FIG. 3 illustrates the step of forming slots in the FFC and aligning connection terminals with respect to the FFC.

Then, as shown in FIG. 3, slots 14A are formed in the FFC 11 between any two conductive strips 12 at a predetermined distance from the end of the FFC 11. Accordingly, a connection area A along the end of the FFC 11 and a separated area B located next to the connection area are defined. In addition to the slots 14A, cutouts 15A are formed along the longitudinal edges of the FFC 11 and in the separated area B.

On the other hand, multiple connection terminals 16 are prepared so that the number of the connection terminals 16 is equal to the number of conductive strips 12. Each connection terminal 16 has a contact 17 and a base plate 18 extending from the trailing end of the contact 17. The base plate 18 has multiple projections 19 that face each other with the base plate between them. In the first embodiment, the contact 17 is a female-type contact, which is a rectangular shell located at the front end of the connection terminal 16.

Figure 4:
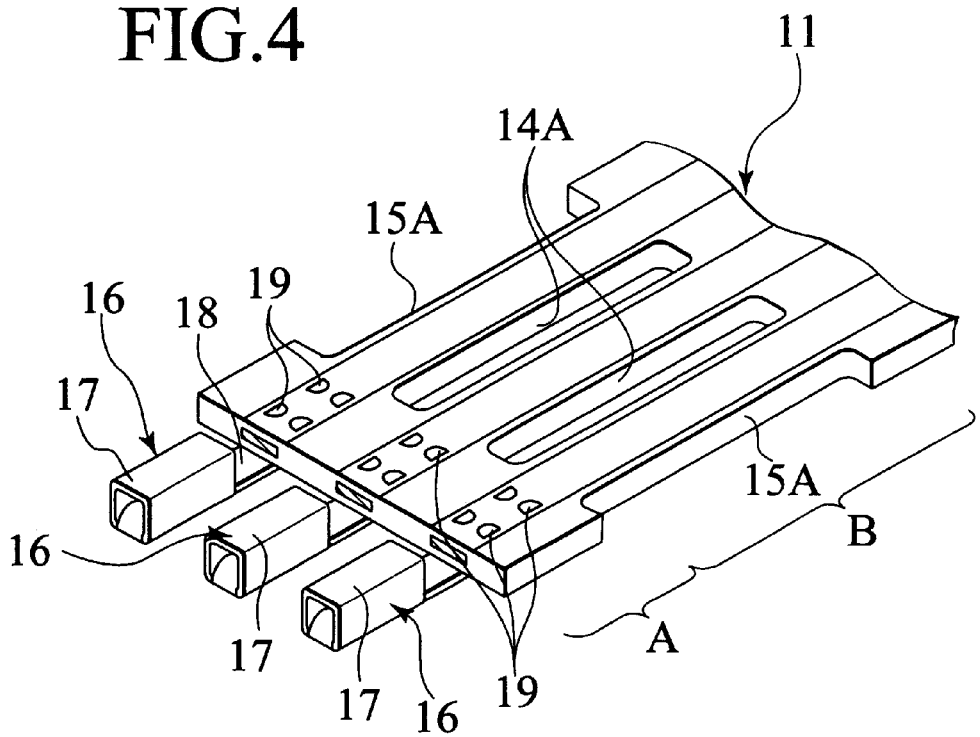
FIG. 4 illustrates the step of fixing the connection terminals to the connection area of the FFC.

Then, as shown in FIG. 4, the connection terminals 16 are fixed to the connection area of the FFC 11 so that each connection terminal 16 corresponds to one of the conductive strips 12. The connection terminals 16 are positioned with respect to the connection area A, and the projections 19 are caused to pierce through the associated conductive strips 12 coated by the base films 13. The tips of the projections 19 are then bent using a piercing tool so that the tips stick again into the conductive strips 12.

The gap between the facing projections 19 is set narrower than the width of the conductive strip 12 so that all the projections 19 pierce through the conductive strip 12. The projection 19 is high enough to pierce through the FFC 11 and to be bent and stick again into the FFC 11.

Figure 5:
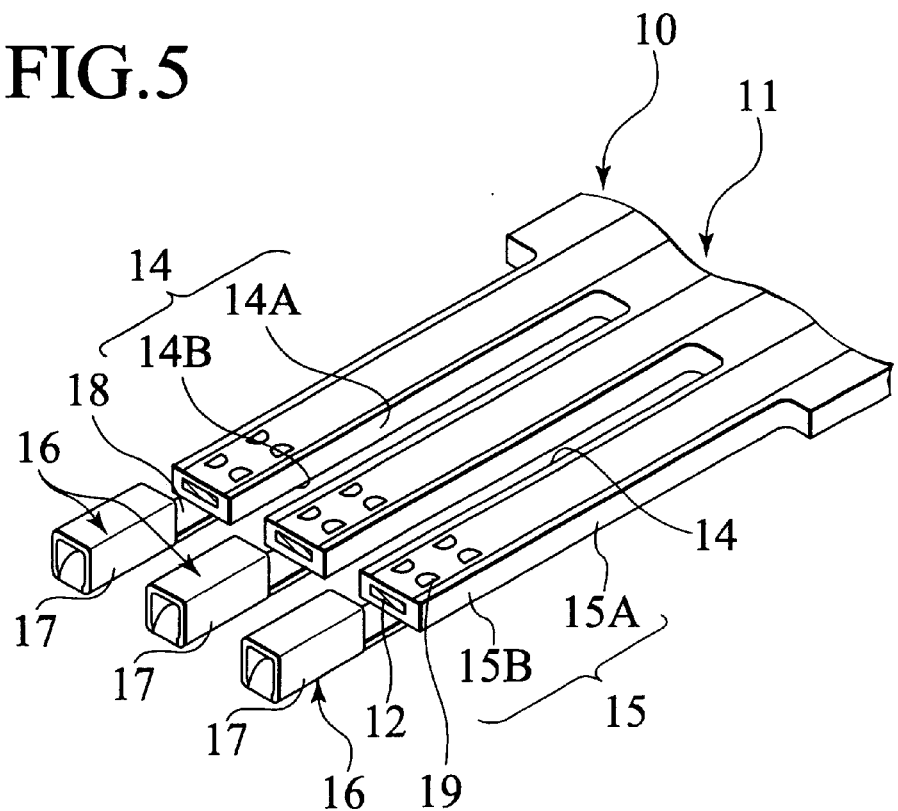
FIG. 5 illustrates the step of forming slits in the FFC from the end of the FFC so as to communicate with the associated slots.

Finally, as shown in FIG. 5, slits 14B are formed between any two adjacent conductive strips 12 so that each slit 14B communicates with the associated slot 14B. By connecting the slits 14B to the slots 14A, the end portion of the FFC 11 is branched out, each branch having a connection terminal 16. Furthermore, new cutouts 15B are formed along the longitudinal edges of the FFC 11 so as to be connected to the previously formed cutouts 15A. In this manner, the wire harness 10 with branch terminals is completed. The branch terminals, each consisting of a connection terminal 16 and a branch portion of the FFC 11, are then inserted in a connector housing (not shown). The female contact 17 of the connection terminal 16 is to receive a contact of a counterpart connector when the wire harness is installed.

With the method, the connection terminals 16 are fixed to the end portion of the FFC 11 before the FFC 11 is branched out. The base films 13 securely hold the conductive strips 12 at the end portion of the FFC 11, and therefore, connection terminals 16 are positioned in a reliably manner with respect to the associated conductive strips 12 without offset or displacement. As a result, electrical connection between the FFC 11 and the connection terminals 16 is guaranteed.

(Second Embodiment)

Figure 6:
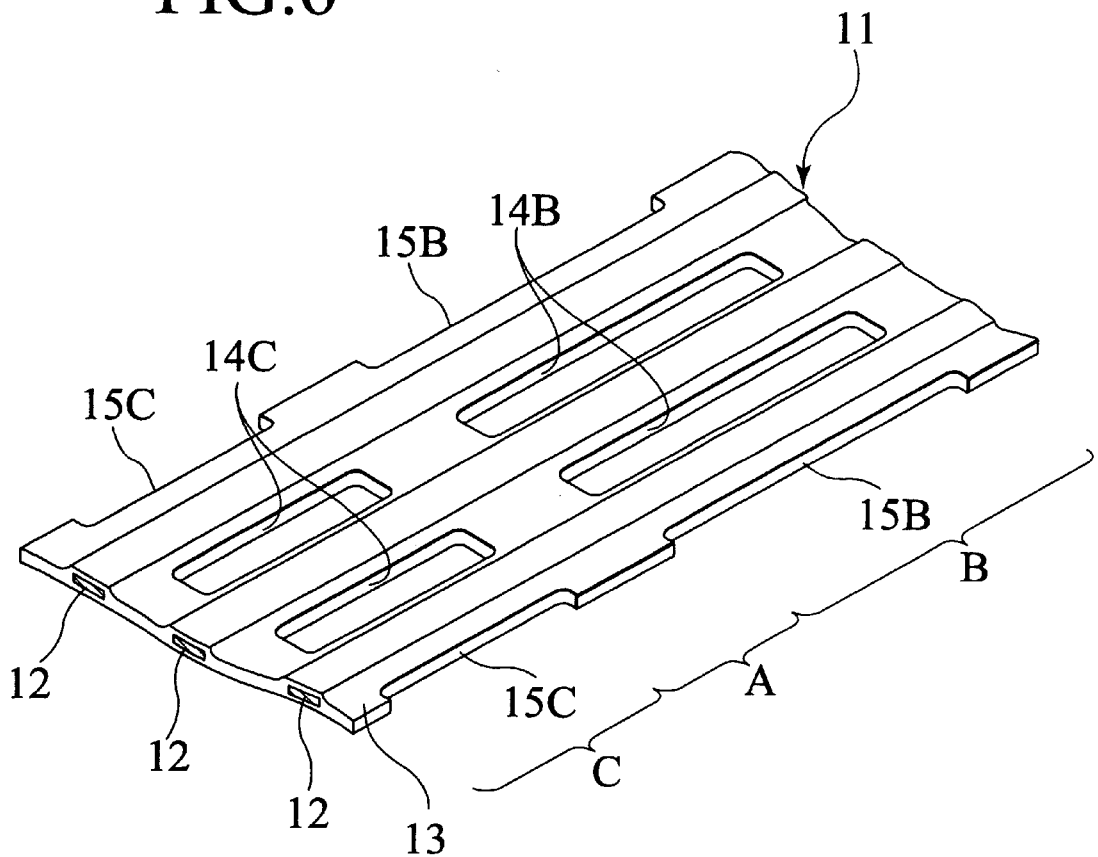
FIG. 6 illustrates a method of fabricating a wire harness according to the second embodiment of the invention, in which two rows of slots are formed in the FFC.
Figure 7:
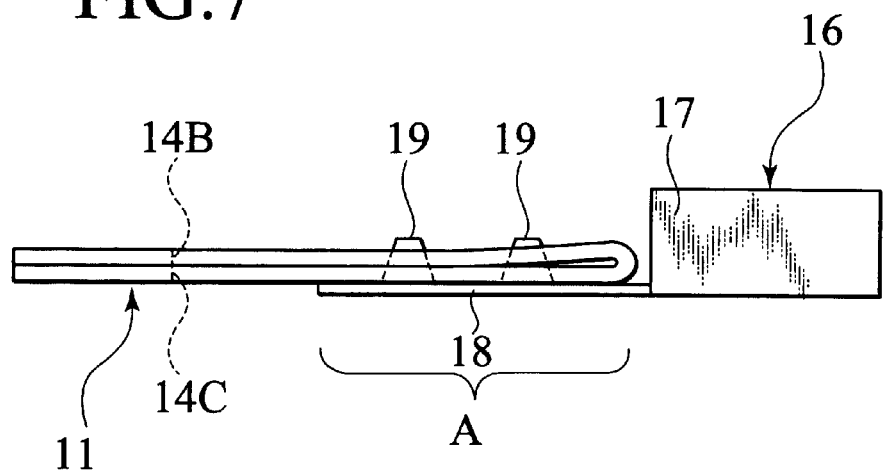
FIG. 7 illustrates a folded FFC and the connection terminals fixed to the folded portion of the FFC according to the second embodiment of the invention.

FIGS. 6 and 7 illustrate a process of fabricating a wire harness according to the second embodiment of the invention. In the second embodiment, a FFC 11 is folded in double, and connection terminals are fixed to the folded portion of the FFC 11.

First, as shown in FIG. 6, a FFC 11 is prepared by arranging multiple conductive strips (e.g., rolled copper foils) 12 in parallel to each other at a predetermined interval and sandwiching the conductive strips 12 with a pair of base films 13. Any two adjacent conductive strips define a non-conductive region between them, as in the first embodiment. Then, two rows of slots 14B, 14C are formed in the middle of the FFC 11 in such a manner that two slots are aligned along the longitudinal axis of each non-conductive region of the FFC 11. A connection area A is defined in the middle of the FFC 11 between the two rows of slots, and separated areas B and C are located on both sides of the connection area A. Cutouts 15B and 15C are formed along the longitudinal edges of the FFC in the separated areas B and C. The two rows of slots are symmetrical with respect to a centerline extending in the width direction of FFC 11 and between the two rows.

Then, as shown in FIG. 7, the FFC 11 is folded in double along the centerline, so that the row of slots 14B lies on top of the row of slots 14C. Multiple connection terminals 16 are fixed to the connection area A, which is also doubled along the centerline. Each connection terminal 16 has a rectangular contact 17 and a base plate 18 extending from the trailing end of the contact 17, as in the first embodiment. The base plate 18 has pairs of projections 19, each pair of projections 19 facing each other with the base plate 18 between them. The projections 19 pierce through the doubled conductive film 12, and the tips of the projections 19 are bent so that the tips stick again into the conductive film 12.

Finally, slits extending from the folded edge to the overlaid slots 14B and 14C are formed in the doubled connection area A in order to branch out the folded FFC 11.

The connection area of the FFC 11 is cut into branches after the connection terminals 16 are fixed to the connection area, as in the first embodiment. Accordingly, the connection terminals 16 are appropriately positioned with respect to the associated conductive strips 12. Undesirable offset or displacement of the connection terminals 16 from the conductive strip 12 is effectively prevented, and reliable electric connection between the FFC 11 and the connection terminals 16 is achieved.

In either the first or second embodiment, the step of forming slots prior to fixing the connection terminals may be omitted. In this case, the connection terminals are fixed to the end portion or the folded portion of the FFC 11, and then, slits are formed at a predetermined length so as to branch out the FFC 11.

Although the invention has been described using the preferred embodiments, the invention is not limited to these examples, and there are many modifications and substitutions without departing the scope of the invention.

For example, a flexible flat cable (FFC) is used as a flexible circuit belt in the embodiment; however, a flexible print circuit (FPC) may be used as the flexible circuit belt used in the wire harness. In this case, the flexible circuit belt is prepared by forming conductive strips on a first base film by etching or plating, and forming a second base film over the conductive strips and the first base film.

The connection terminal may have a male contact in place of the female contact. The slots may be formed by, for example, punching the base films. Such modifications or substitutions are intended to be included in the scope of the invention defined by the appended claims.

What is claimed is:

1. A method for fabricating a wire harness with branch terminals, comprising the steps of:

preparing a flexible circuit belt that has two or more conductive strips arranged in parallel to each other at a predetermined interval and sandwiched by a pair of base films;

fixing connection terminals, each having a contact and a plurality of projections, to an end portion of the flexible circuit belt by causing the projections of each connection terminal to pierce through one of the conductive strips; and after fixing the connection terminals, forming one or more slits between any two adjacent conductive strips, each slit extending from an edge of the end portion at a predetermined length, thereby branching out the flexible circuit belt.

2. The method of claim 1, wherein the step of preparing a flexible circuit belt includes laminating the base films with the conductive strips between them.

3. The method of claim 1, wherein the step of preparing a flexible circuit belt includes forming conductive strips by etching or plating on a first base film, and forming a second base film over the conductive strips and the first base film.

4. The method of claim 1, further comprising the step of inserting the connection terminals fixed to the associated branches of the flexible circuit belt into a connector housing.

5. A method for fabricating a wire harness with branch terminals, comprising the steps of:

preparing a flexible circuit belt that has two or more conductive strips arranged in parallel to each other at a predetermined interval and a pair of base films sandwiching the conductive strips;

forming a row of slots between any two adjacent conductive strips at a predetermined distance from an end of the flexible circuit belt, thereby defining a connection area between the end of the flexible circuit belt and the row of slots;

fixing connection terminals, each having a contact and a plurality of projections, to the connection area of the flexible circuit belt by causing the projections of each connection terminal to pierce through one of the conductive strips; and after fixing the connection terminals, forming one or more slits between any two adjacent conductive strips so that the slits extend from the end of the flexible circuit belt and communicate with the associated slots.

6. The method of claim 5, wherein the step of preparing a flexible circuit belt includes laminating the base films with the conductive strips between them.

7. The method of claim 5, wherein the step of preparing a flexible circuit belt includes forming conductive strips on a first base film by etching or plating, and forming a second base film over the conductive strips and the first base film.

8. The method of claim 5, further comprising the step of inserting the connection terminals fixed to the associated branches of the flexible circuit belt into a connector housing.

9. A method for fabricating a wire harness with branch terminals, comprising the steps of:

preparing a flexible circuit belt that has two or more conductive strips arranged in parallel to each other at a predetermined interval and a pair of base films sandwiching the conductive strips, any two adjacent conductive strips defining a non-conductive region between them;

forming two rows of slots in the middle of the flexible circuit belt in such a manner that two slots are aligned along a longitudinal axis of each non-conductive region of the flexible circuit belt at a predetermined distance between them, the two rows of slots being symmetrical with respect to a centerline extending in the width direction of the flexible circuit belt between the rows;

folding the flexible circuit belt in double along the centerline between the two rows of slots so that a row of slots lies on top of the other row of slots;

fixing connection terminals, each having a contact and a plurality of projections, to the folded portion of the flexible circuit belt by causing the projections of each connection terminal to pierce through one of the doubled conductive strips of the folded flexible circuit belt; and after fixing the connection terminals, forming one or more slits between any adjacent conductive strips, the slits extending from the folded edge of the flexible circuit belt and communicating with the overlaid slots.

10. The method of claim 9, wherein the step of preparing a flexible circuit belt includes laminating the base films with the conductive strips between them.

11. The method of claim 9, wherein the step of preparing a flexible circuit belt includes forming conductive strips on a first base film by etching or plating, and forming a second base film over the conductive strips and the first base film.

12. The method of claim 9, further comprising the step of inserting the connection terminals fixed to the associated branches of the flexible circuit belt into a connector housing.

* * * * *